United States Patent [19]

Endler et al.

[11] Patent Number: 5,291,201

[45] Date of Patent: Mar. 1, 1994

[54] MICROWAVE INTEGRATED CIRCUIT FREQUENCY TRANSLATING APPARATUS

[75] Inventors: Harvey Endler, Van Nuys; Farid Mesghali, Culver City, both of Calif.

[73] Assignee: Systron Donner Corporation, Sylmar, Calif.

[21] Appl. No.: 21,203

[22] Filed: Feb. 23, 1993

[51] Int. Cl.[5] ............................................. G01S 7/38
[52] U.S. Cl. ...................................... 342/14; 342/13; 342/15
[58] Field of Search .................. 342/13, 14, 15, 194

[56] References Cited

U.S. PATENT DOCUMENTS

| | | | |
|---|---|---|---|
| 4,083,004 | 4/1978 | Cohn | 342/13 |
| 4,713,662 | 12/1987 | Wiegand | 342/13 |
| 4,876,546 | 10/1989 | Koerner | 342/15 |
| 5,003,312 | 3/1991 | Madni et al. | 342/15 |

OTHER PUBLICATIONS

"Multioctave, Double-Balanced Mixers designed using MIC Technology", Ram Mohan Narayanan, MSNGCT Jan. 1987.

*Primary Examiner*—Mark Hellner
*Attorney, Agent, or Firm*—Flehr, Hohbach, Test, Albritton & Herbert

[57] ABSTRACT

A microwave integrated circuit for frequency translation includes a pair of mixers for receiving the input RF signal, mixing it with a pair of quadrature frequency modulation signals and by combining the output of the mixers in a quadrature coupler, suppressing all signals except for the input RF signal plus the modulation frequency. This is accomplished in an environment of high "g" forces, significant temperature variations and a need for high reliability and fast operation by a miniaturized microwave integrated circuit having microstrips on the top and bottom sides of a ceramic substrate. The mixers consist of quad diode chips which are compression welded to one side of the microstrip for good resistance to high "g" forces. Suitable balancing is provided by use of a ground plane on the opposite side with tapering. A quadrature coupler to suppress the lower sideband is in the form of a LANGE coupler which is effectively integrated on the top side of the substrate.

8 Claims, 5 Drawing Sheets

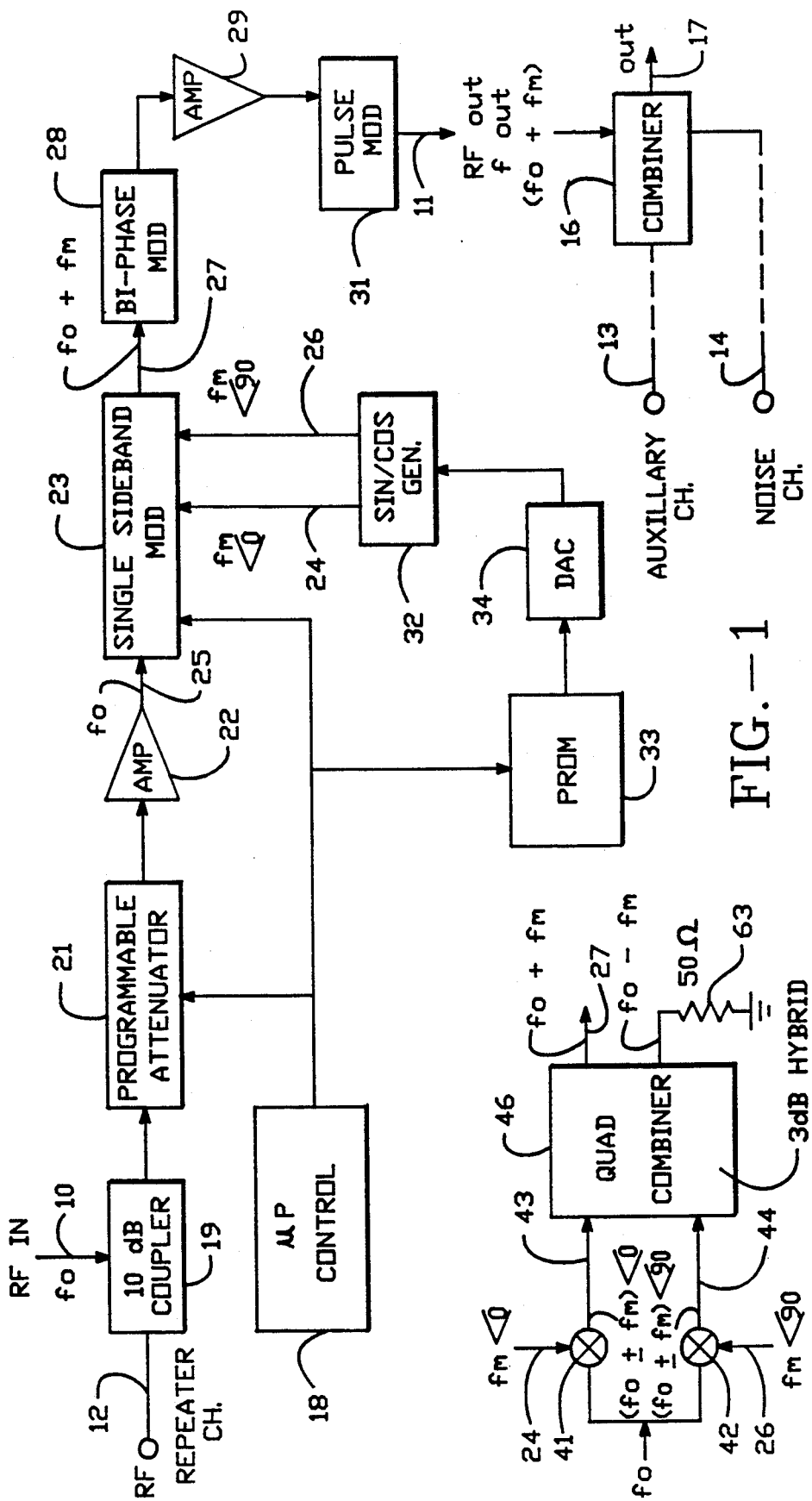

MICROWAVE INTEGRATED CIRCUIT FREQUENCY TRANSLATING APPARATUS

BACKGROUND OF THE INVENTION

The present invention is directed to a microwave integrated circuit frequency translating apparatus and more specifically to apparatus used in electronic countermeasure (ECM) systems.

Fast phase shift or frequency translators are required in several areas particularly in the radar and electronic countermeasures (ECM) fields. A typical multimode ECM device using a serrodyne technique is shown in U.S. Pat. No. 5,003,312 entitled Multiple Mode Velocity Deception Apparatus and assigned to the present assignee. Such a system is typically mounted in the electronics pod of an airplane which wishes to deceive enemy radar by sending a false return signal. Because of the environment and the nature of the use of the frequency translator, it is desirable that it be economical, reliable, resistant to high "g" forces, versatile, of a relatively small size, and also able to operate over a wide temperature range.

OBJECT AND SUMMARY OF INVENTION

It is therefore a general object of the present invention to provide an improved frequency translating apparatus.

In accordance with the above object, there is provided frequency translating apparatus for receiving radar or other microwave signals, fo, and frequency translating them to a signal, fo+fm, comprising a single sideband (SSB) modulator formed as a thinfilm planar hybrid type microwave integrated circuit on a high "g" force insulating substrate with microstrip conductors both on the top and bottom sides of the substrate. The SSB modulator includes a pair of mixer means for receiving fo and mixing with two quadrature phase modulating signals fm to produce two quadrature output signals fo±fm at 0° and fo±fm at 90°. It also includes quadrature coupler means responsive to the quadrature output signals to combine them for providing the frequency translated signal, fo+fm and the suppression of fo and fo−fm. Each of the mixer means includes a beam lead diode quad chip in a ring configuration bonded to the microstrip conductors of the substrate to provide the planar circuit tolerant of the high "g" force. The quadrature coupler means is formed as microstrip on the substrate and conductively connected to the diode quad chips.

BRIEF DESCRIPTION OF THE DRAWINGS

FIG. 1 is a block diagram embodying the frequency translating apparatus of the present invention.

FIG. 2 is a more detailed circuit schematic of a portion of FIG. 1.

BRIEF DESCRIPTION AND PREFERRED EMBODIMENT

Figure 3:
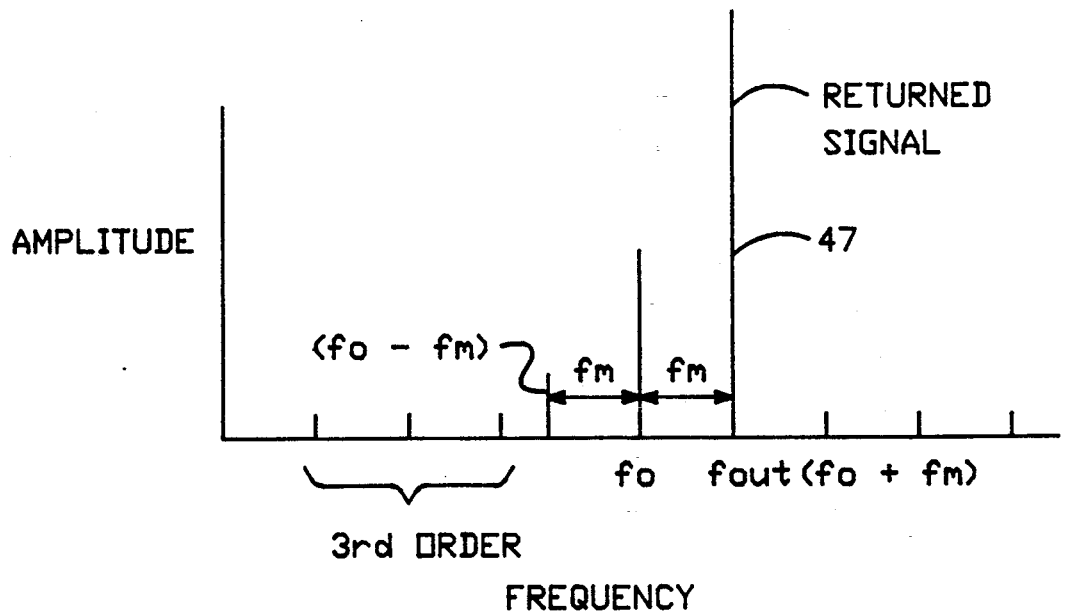
FIG. 3 is a frequency/amplitude diagram illustrating the functioning of FIG. 1.

FIG. 1 shows a multiple technique deception jammer which frequency translates a received radar signal RF ($f_0$) on line 10 and provides at its RF out 11 a translated signal $f_{out}$ which is actually $f_0+$ the modulating or translating frequency $f_m$. As shown it is a multiple technique since it includes on line 12 a repeater channel and on lines 13 and 14 an auxiliary channel and a noise channel. These are effectively combined in a combiner 16 along with the RF out translated signal 11 to provide a final output signal on line 17.

Referring now specifically to the repeater channel 12 a microprocessor control unit 18 exercises overall timing and synchronization over the various other blocks. These include the 10 db coupler 19 which receives the radio frequency (RF) input signal on line 10 and also the repeater signal on line 12 which are coupled to a programmable attenuator 21. The signal is amplified by amplifier 22 and its output on line 25, is then connected to a single sideband (SSB) modulator 23. This modulates the radio frequency input signal $f_0$ both with a modulating signal on line 24, $f_m$ at a 0° phase angle and on line 26, $f_m$ at a 90° phase angle to produce at its output 27 a frequency translated signal $f_0+f_m$.

Bi-phase modulation is provided by unit 28 if desired, the signal amplified by amplifier 29 and then pulse modulated at 31 to provide on line 11 the final output signal. Pulse modulator 31 can be described as a rectangular amplitude modulator but its function is as a pulse modulator having a variable duty cycle.

To provide the quadrature modulating signals, $f_m$, on lines 24 and 26, there is a SIN/COS generator or driver 32 which receives the desired modulation inputs as determined by the microprocessor control unit 18 from a PROM unit 33 and a digital analog converter (DAC) 34. Briefly, these units along with the SIN/COS generator provide a so-called "walk" time to the output signal $f_{out}$; in other words, the amount of frequency translation.

FIG. 2 illustrates the circuitry to produce the output signal on line 27 ($f_0+f_m$). This is what the SSB modulator consists of. Here mixers 41 and 42 are driven by the input signal $f_o$ and the modulating signals on lines 24 and 26, which are quadrature phased 90° apart. These provide, as indicated, the outputs 43, 44 of the mixers; the $f_o \pm f_m$ at 0° on line 43 and $f_o \pm f_m$ at 90° on line 44. These are then combined in a quad combiner 46 which acts as a three decibel hybrid quadrature coupler which on one of its outputs 27 provides the final $f_o+f_m$ (the frequency translated signal). The other output is an $f_o-f_m$ which is an unwanted signal which should be suppressed and this is terminated in a 50 ohm matching resistance (a thin film resistor which is actually part of the hybrid microwave integrated circuit). The frequency/amplitude graph of FIG. 3 illustrates the functioning of the circuits of FIGS. 1 and 2 where the relative amplitudes of all of the output signals produced by the single sideband modulator are illustrated. Naturally the spike frequency 47 designated $f_{out}$ and also "returned signal" has a significantly higher amplitude than any of the other signals. Thus the present construction of this signal sideband modulator has suppressed the $f_o$ carrier signal and the lower sideband signal $f_o - f_m$. In addition, the third order signals are of greatly reduced amplitude. In fact, with the present invention the carrier and sideband suppression is greater than 25 dB over a double-octave (4:1) bandwidth.

Figure 4:
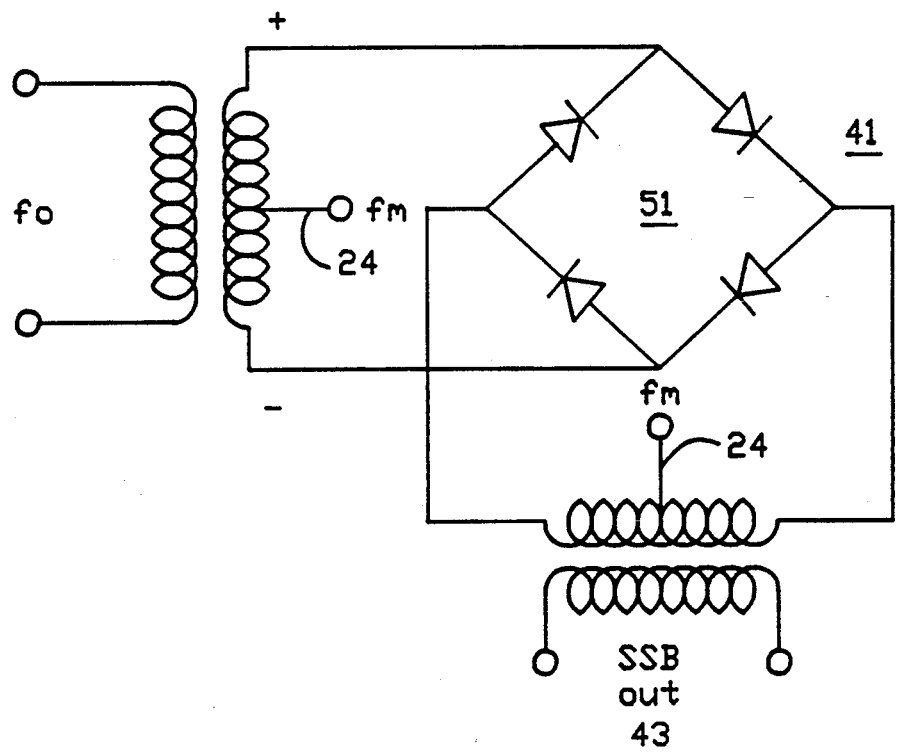
FIG. 4 is a very simplified circuit schematic illustrating a portion of FIG. 2.

The single sideband modulator unit 23 is implemented as a microwave integrated circuit (MIC) as will be immediately discussed below but part of it can be shown in very simplified form in FIG. 4. This illustrates a single mixer unit, for example, 41 (see FIG. 2) having an $f_o$ input, the frequency modulating, $f_m$, input 24 and an output at 43. It includes a beam lead diode quad chip 51 which has four ring connected silicon Schottky barrier diodes. Alternatively gallium arsenide diodes may be used. Such a beam lead diode chip of this type as will be explained below can be bonded by thermocompression welding to a gold metallized substrate to provide a circuit tolerant of high "g" forces. As specifically shown in FIG. 4 the circuit is a double balanced mixer; its operation in a different context is discussed and analyzed in an article in MSN&CT January 1987 - "Multi-octave Double Balance Mixers Designed Using MIC Technology".

Figure 5:
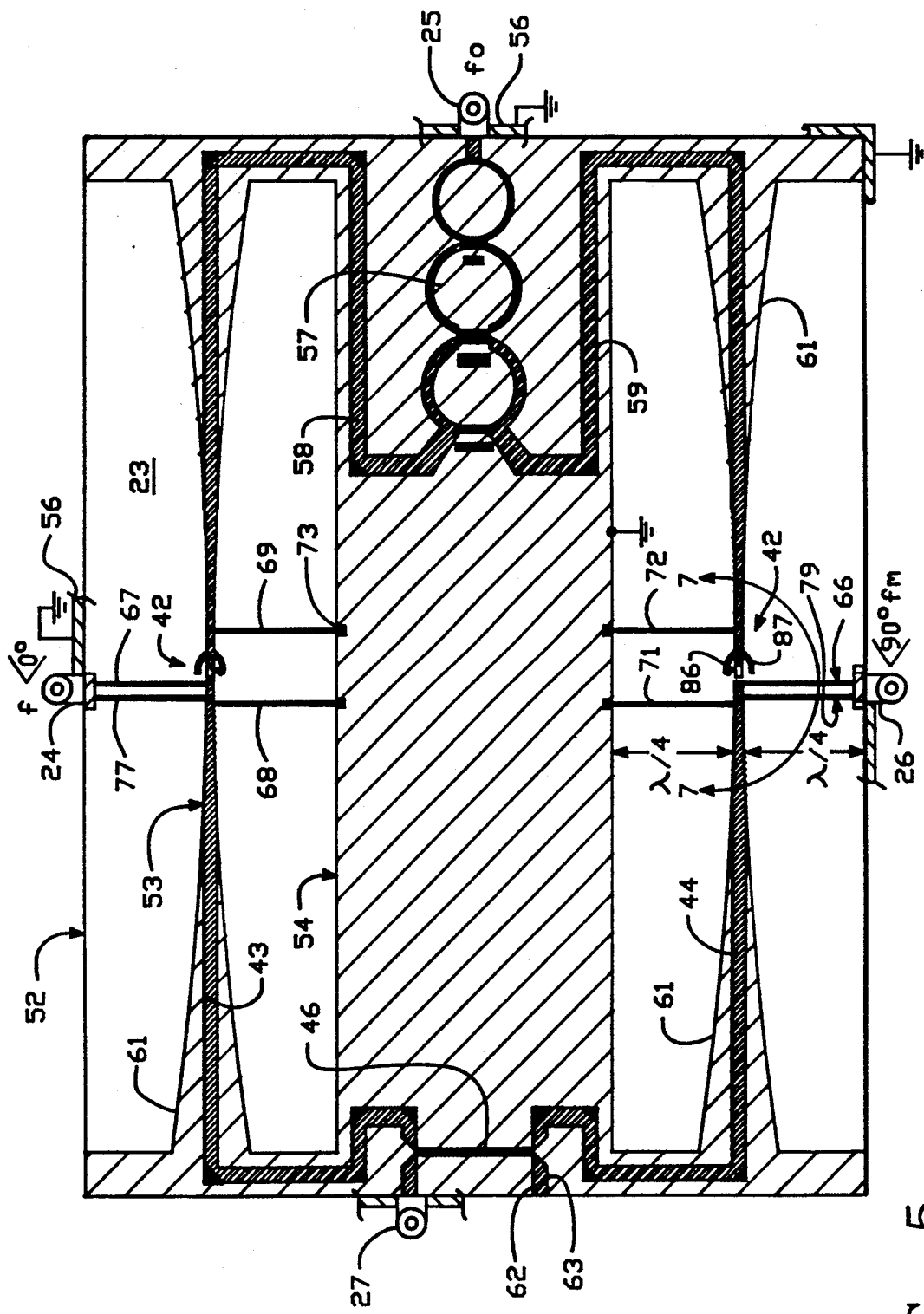
FIG. 5 is a plan view of a substrate of the present invention showing a microwave insulated circuit, the top side superimposed over the bottom side.

FIG. 5 shows a microwave integrated circuit 23 which constitutes the single sideband modulator of FIG. 1. Coaxial inputs are 25, $f_o$ and also the $f_m$ frequency modulator inputs 24 and 26; the output on coaxial line 27 is the translated signal. The mixer 23 includes an alumina ceramic substrate 52 highly resistant to "g" forces and very durable. Moreover the substrate is very resistant to temperature changes. The top side of the circuit is indicated as a double cross hatched microstrip 53 and the bottom side is a single cross hatched microstrip 54 over which top side 53 is superimposed. The bottom side provides an effective ground plane. In addition this ground plane is connected to a metal conductive box 56 which surrounds the edges of the ceramic 52. It is quite apparent for example in the case of the $f_o$ input 25 which is coaxial that the outer conductor is attached to the metal ground plane. The same is true of the coaxial output 27 and also the coaxial inputs 24 and 26.

Comparing the various effective microwave components of FIG. 5 to the block diagrams of FIGS. 1 and 2, the RF input of $f_o$ 25 is equally split by a three-stage Wilkinson divider 57 into a microstrip conductor 58 which couples to the mixer 41 and a microstrip 59 which couples to mixer 42. It should be noted that the ground plane 54 on the bottom side of the substrate 23 is a tapered microstrip 61. This provides a balun (balancing unit) to match the unbalanced coaxial input 25 to the balanced microstrip lines which go to the mixers 41 and 42. Similarly the same tapering 61 provides a balancing for the coaxial output at 27. It should be parenthetically mentioned that the tapering 61 is illustrated in the above mentioned MSN&CT article.

Figure 9:
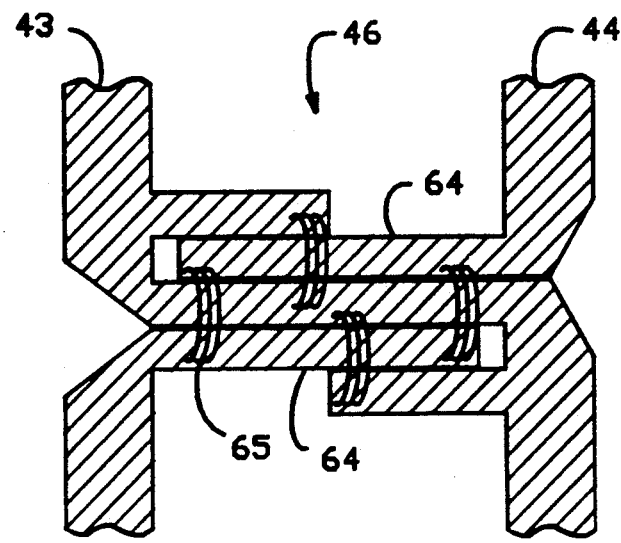
FIG. 9 is a simplified enlarged view of a coupler portion of FIG. 5.

Still referring to that output 27, this output combines the microstrip lines 43 from mixer 41 and 44 from mixer 42 in a quadrature combiner 46 which is effectively a LANGE coupler. This coupler provides, as is well known, one quadrature output at 27 and another quadrature output at 62 which is coupled to the ground plane 54 by a 50 ohm thin film resistor 63 (see also FIG. 2) to terminate this output and match it at the same time. (See the highly suppressed signal $f_0 - f_m$ in FIG. 3.) LANGE coupler 46 is of the form shown in FIG. 9 and consists of three interleaved coupling lines 64 extending from the respective microstrips 43 and 44. These are coupled or strapped at four places on one mil gold wires 65.

In order to isolate the mixers 41 and 42 from the relatively higher frequency signals occurring at the input 25 and output 27 from the relatively lower modulating inputs 24, 26, both mixers 41 and 42 are coupled to their modulating inputs by the respective quarter length transmission lines 66 and 67. Quarter length ground returns are provided at 68 and 69 and 71 and 72. These ground returns are coupled to the ground plane on the bottom side 54 by via holes indicated by the squares one of which is shown at 73. Thus a quarter wavelength long microstrip conductor provides isolation to the higher frequency signals and passes the lower frequency modulating signals $f_m$. A via hole can also allow the thin film resistor 63 to be terminated to the ground plane. Other appropriate via holes are provided for attaching the remaining terminals of the quad mixer chips 41 and 42 which will be described below.

In summary the microwave integrated chip 52 provides for integration of an entire single sideband modulator used for frequency translation and by the nature of its construction it is resistant to high "g" forces, operates over a wide temperature range, is of a small size, and has repeatability in production and reliability; and due to balancing and the specific circuitry of the quad diode chip, high suppression (25 dB) of unwanted frequencies or sidebands is provided. The entire circuit is photolithographically produced with extreme precision.

Other features include the Wilkinson divider 57 having a broad bandwidth and serving as a power divider while matching the remainder of the microstrip conductors and providing for isolation of the input.

Figure 6:
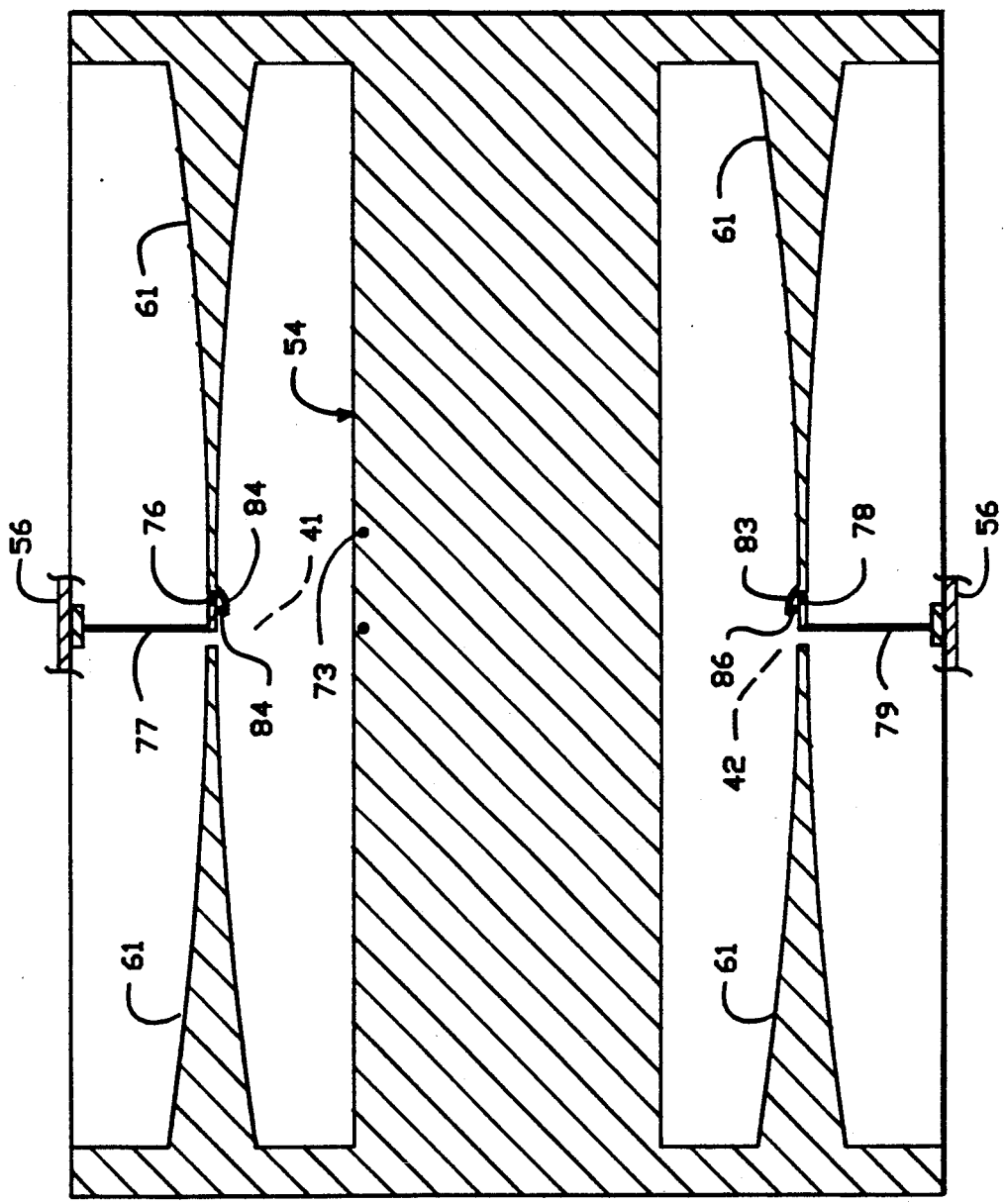
FIG. 6 is a plan view of the bottom side only of FIG. 5.

FIG. 6 illustrates the bottom side of the integrated circuit 23 and shows that a connection for each of the mixers at 41 and 42 is a pair of via holes. In the case of mixer 41, there is a via hole 76 which extends via quarter wavelength line 77 to the modulation input connection sidewall 56 of the substrate. In the case of mixer 42, there is a via hole 78 which via the quarter wavelength line 79 extends again to the sidewall 56. Then the other connections from the tapered conductors or microstrip 61 are in the form of curved arms 82 and 83 which connect to the mixer through via holes 84 and 86.

Figure 7:
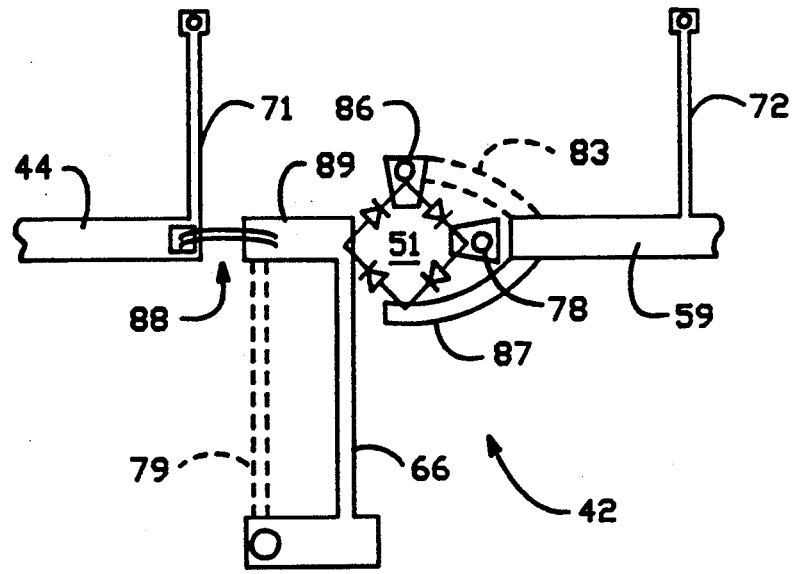
FIG. 7 is a greatly enlarged and representational view of a portion of FIG. 5 taken along the line 7—7.

FIG. 7 illustrates the foregoing in greater clarity in conjunction with the mixer 42. Here the quad chip 51 has, of course, four terminals. Each terminal is thermocompression bonded to a microstrip. One connects to the tab 89 of the quarter wavelength line 66. This is, of course, on the top side. The other top side connection is the curved extension 87 of the microstrip 59. Then through the via holes 86 and 78, as illustrated in FIG. 6, the other two corners of the bridge are connected. Microstrip portion 44 which goes to the LANGE coupler 46 is grounded by the quarter wavelength line 71 to the ground plane (this is of course for the modulating frequencies only) but is effectively transformed and coupled by the close spacing at 88 (along with the strapping) to the microstrip portion 89 on which that corner of the quad chip is fastened. Then as shown in dashed outline, line 79 as best illustrated in FIG. 6, is grounded at one end by the wall 56 and connected to the final fourth chip terminal through via hole 78.

Figure 8:
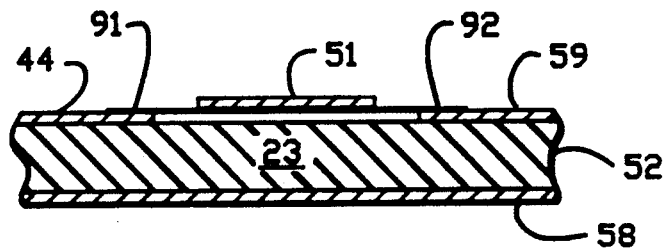
FIG. 8 is a simplified and enlarged cross-sectional view of a portion of FIG. 7.

As illustrated in FIG. 8 the quad chip 51 is thermocompression bonded to gold microstrip portions or thermally welded as indicated at 91 and 92 to the ceramic substrate 23. This is a very simplified cross section of the circuit shown in FIG. 7. This mounting of the Schottky barrier quad chip 51 provides a planar surface but with high resistance to "g" forces.

With respect to the selection of the quad chip 51 for both mixers 41 and 42, in order to provide as briefly discussed above, for good third order harmonic suppression, the Schottky diodes of the chip should be selected so that they have a high forward breakdown of voltage (for example, 0.5 volts). Chips of this type are commercially available with such high breakdown voltage as compared to "medium" or "low" breakdown voltages. In the specific frequency translation circuit of the present invention, it has been discovered that the high breakdown voltage results in effective suppression of third order harmonics as illustrated in FIG. 3.

Thus the present invention has provided a microwave integrated circuit for frequency translation.

What is claimed is:

1. Frequency translating apparatus for receiving radar or other microwave signals of frequency, $f_o$, and frequency translating them to a signal of frequency $f_o+f_m$, comprising:

a single sideband (SSB) modulator formed as a thin-film planar hybrid type microwave integrated circuit on a high "g" force insulating substrate with microstrip conductors both on the top and bottom sides of said substrate, said SSB modulator including a pair of mixer means for receiving fo and mixing fo with two quadrature phase modulating signals $f_m$ to produce two quadrature output signals $f_o \pm f_m$ at 0° and $f_o \pm f_m$ at 90° and including quadrature coupler means responsive to said quadrature output signals to combine them for providing said frequency translated signal, $f_o+f_m$, and to suppress the other output signals of frequency $f_o$ and $f_o-f_m$, each of said mixer means including a beam lead diode quad chip in a ring configuration bonded to said microstrip conductors of said substrate to provide said planar circuit tolerant of said high "g" force, said quadrature coupler means being formed as microstrip on said substrate and conductively connected to said diode quad chips.

2. Frequency translating apparatus as in claim 1 where the diodes of each diode quad chip has a high forward breakdown voltage relative to a medium or low voltage for further suppressing any third order outputs of said mixer means.

3. Frequency translating apparatus as in claim 1 where quadrature coupler means has a pair of outputs with one being said $f_o+f_m$ and the other $f_o-f_m$ and including thin film impedance matching resistor means attached to said substrate for terminating said $f_o-f_m$ output.

4. Frequency translating apparatus as in claim 1 where said microstrip conductors on said bottom side provide a ground plane and are tapered and juxtaposed with top side microstrip to provide an effective balancing unit to match unbalanced coaxial input and outputs $f_o$ and $f_o+f_m$.

5. Frequency translating apparatus as in claim 4 where said diode quad chips are on said top side and are connected to said ground plane and tapered microstrip on said bottom side by via holes through said substrate.

6. Frequency translating apparatus as in claim 1 where said diode quad chips are coupled to said quadrature phase modulating signal fm by quarter wavelength long microstrip conductor means for providing isolation to said higher frequency signals $f_o$ and $f_o+f_m$.

7. Frequency translating apparatus as in claim 1 where said diode quad chips include silicon Schottky barrier diodes.

8. Frequency translating apparatus as in claim 1 where said suppression of $f_o$ and $f_o-f_m$ relative to $f_o+f_m$ is greater than 25 decibels.

* * * * *